(12) United States Patent
Hayami et al.

(10) Patent No.: US 7,852,900 B2
(45) Date of Patent: Dec. 14, 2010

(54) SEMICONDUCTOR DEVICE, METHOD OF MANUFACTURING THE SAME, AND PRODUCTION EQUIPMENT OF THE SAME

(75) Inventors: Isao Hayami, Hyogo (JP); Masaya Tateyanagi, Shiga (JP)

(73) Assignee: Panasonic Corporation, Osaka (JP)

( * ) Notice: Subject to any disclaimer, the term of this patent is extended or adjusted under 35 U.S.C. 154(b) by 202 days.

(21) Appl. No.: 12/332,770

(22) Filed: Dec. 11, 2008

(65) Prior Publication Data

US 2009/0161712 A1 Jun. 25, 2009

(30) Foreign Application Priority Data

Dec. 20, 2007 (JP) ............... 2007-328091

(51) Int. Cl.
*H01S 3/08* (2006.01)
*H01L 23/12* (2006.01)
*H01L 23/10* (2006.01)

(52) U.S. Cl. .............. 372/103; 257/704; 257/710

(58) Field of Classification Search ............ 372/103; 257/704, 710

See application file for complete search history.

(56) References Cited

U.S. PATENT DOCUMENTS

| 7,075,178 | B2 | 7/2006 | Yamamoto | 257/687 |
| 2005/0265413 | A1 | 12/2005 | Tsuda et al. | 372/43.01 |
| 2006/0292720 | A1 | 12/2006 | Nishikawa | 438/26 |
| 2007/0063212 | A1 | 3/2007 | Watanabe et al. | 257/99 |
| 2007/0248133 | A1 | 10/2007 | Shinohara et al. | 372/44.01 |

FOREIGN PATENT DOCUMENTS

JP 2006-41213 2/2006

*Primary Examiner*—Armando Rodriguez
(74) *Attorney, Agent, or Firm*—Steptoe & Johnson LLP

(57) ABSTRACT

A cap 25 having a piece of glass 26 formed at a laser irradiating position and covering a laser irradiating direction and an upper face of a package 24, is mounted onto the package 24 having lateral faces of a frame body 30 formed in three directions other than the laser irradiating direction, so as to reduce the distance between a semiconductor element 22 and the piece of glass 26 and to reduce a radius 32 of the piece of glass 26. The profile of the semiconductor device can be therefore lowered while maintaining the characteristics of a semiconductor laser. In addition, by mounting the semiconductor device, the profile of an optical pickup device can also be lowered.

16 Claims, 10 Drawing Sheets

SEMICONDUCTOR DEVICE, METHOD OF MANUFACTURING THE SAME, AND PRODUCTION EQUIPMENT OF THE SAME

FIELD OF THE INVENTION

The present invention relates to a semiconductor device that integrates a laser and a light receiving element to be used in a rewritable optical disk, a method of manufacturing the same, and production equipment of the same.

BACKGROUND OF THE INVENTION

In recent years, large-capacity rewritable optical disks have rapidly become popular through incorporation into DVD recorders, personal computers, and Blu-ray recorders. Moreover, in the case of optical disks mounted in mobile devices such as a lap-top computer, there have been strong demands for optical disk drives with lower profiles.

In order to lower the profile of an optical disk drive, it is important to lower the profile of an optical pickup device. It is anticipated that such profile-lowering can be achieved in the optical design or the mechanism design of an optical pickup device by revising the structures of primary components while retaining performance and functions of such primary components.

Examples of primary components of an optical pickup device include a semiconductor laser and a signal detecting light receiving element. Profile-lowering of an optical pickup device can be achieved by lowering the profiles of such semiconductor devices.

As an example, structural schematic diagrams of a conventional semiconductor device are shown in FIGS. 11A, 11B, and 11C. FIG. 11A is a perspective view of a semiconductor device; FIG. 11B is a perspective view of the semiconductor device before applying a cap; and FIG. 11C is a cross-sectional view showing an internal structure of the semiconductor device.

In FIGS. 11A, 11B, and 11C, a semiconductor device 1 includes: a semiconductor laser 2; a semiconductor laser submount 3; a package 4; a cap 5; a piece of glass 6 that transmits a laser light 10 outputted by the semiconductor laser 2; a pair of lead terminals 7; a wire 8 connecting both anode and cathode electrodes of the semiconductor laser 2 and the lead terminals 7; and a piece of low-melting glass 9 for fixing the lead terminals 7 to a penetrating hole provided on the package 4.

In a method of manufacturing the semiconductor device 1 shown in FIGS. 11A, 11B, and 11C, the package 4 is fixed in advance by the piece of low-melting glass 9 to the lead terminals 7 electrically connected to the semiconductor laser 2 and leading out of the package. The semiconductor laser 2 mounted on the submount 3 is then bonded to the package 4. Next, both the anode and cathode electrodes of the semiconductor laser 2 are connected by the wire 8 to the pair of lead terminals 7. Next, the piece of glass 6 is fixed to a window provided on a lateral face of the package by the piece of low-melting glass 9. Finally, the cap 5 is fixed and sealed onto an upper face of the package by an adhesive or by seam welding.

The profile of the semiconductor device 1 shown in FIGS. 11A, 11B, and 11C is lowered as a configuration that outputs a laser light 10 of the semiconductor laser 2 from a lateral face of the package 4, and is capable of responding to demands for a thickness 11 of the package 4 of 2.4 mm or greater. In addition, by using metal for the package 4 and the cap 5, and sealing the piece of glass 6 and the lead terminals 7 by the piece of low-melting glass 9 and the cap 5 by seam welding, hermetic sealing can also be achieved.

The profile of an optical pickup device 12 can also be lowered by using the semiconductor device 1.

FIG. 12 shows a schematic diagram exemplifying a conventional optical pickup device equipped with a conventional semiconductor device.

In FIG. 12, the semiconductor device 1 is mounted in a chassis 13 of the optical pickup device 12. The semiconductor device 1 and an optical disk 14 are optically linked via an optical component 15 that, in this case, is a collimated lens, an erecting mirror 16, and an objective lens 17. More specifically, a laser light 18 outputted from a semiconductor laser chip (not shown) of the semiconductor device 1 shown in FIG. 12 is collimated to a parallel light by the optical component 15, has its optical path bent by 90 degrees by the erecting mirror 16, and is focused on a pit recorded on the optical disk 14 by the objective lens 17. Having read a signal on the pit, the laser light 18 is reflected by the optical disk 14 and proceeds along the same route in the opposite direction. At this point, the laser light 18 is bifurcated by a diffraction optical component 19 disposed between the optical component 15 and the erecting mirror 16, collected by the optical component 15, and enters a light receiving element (not shown) to read the signal recorded on the optical disk 14.

In order to lower the profile of the optical pickup device 12, the thickness 11 of the semiconductor device 1 may be reduced. In other words, by reducing the thickness 11 of the semiconductor device 1, the profile of the optical disk drive can be lowered.

DISCLOSURE OF THE INVENTION

Today, as profiles of mobile devices such as lap-top computers are lowered, demands are being made for lowering the profiles of optical disk drives to be mounted, as well as for further lowering of the profiles of semiconductor devices.

However, with a conventional semiconductor device, since a window is provided on a lateral face of a package frame body, when considering the shape of a collet for mounting a semiconductor laser or a mounting accuracy thereof, the mounting position of the semiconductor laser ends up on the center side of the package and the package frame body itself must have a certain thickness. Thus, the distance from an output face of the semiconductor laser to the outside of the package window is increased, necessitating that the aperture of the window be widened to allow for laser light output. This is a disincentive towards lowering package profiles. More specifically, with the aforementioned conventional semiconductor device, achieving a semiconductor device with a thickness of less than 2.4 mm, and in particular, a semiconductor device with a thickness equal to or less than 2 mm is difficult. In addition, in the event that lowering the profile of a semiconductor device prevents a sufficient window aperture from being secured, a portion of a laser light is reflected off of a lateral face of the package, becoming stray light that causes optical interference and affecting the properties of the semiconductor laser. Incidentally, while the angle of spread of laser light outputted from the semiconductor laser is assumed to be at least 30 degrees, in consideration of the optical interference by the stray light, it is desirable to have the aperture of the package with a spread angle equal to or greater than 30 degrees.

The present invention has been made to solve such conventional problems, and its object is to lower the profile of a semiconductor device that is a semiconductor laser device while retaining the characteristics of the semiconductor laser, and to lower the profiles of an optical pickup device and an optical disk drive device which use the semiconductor device.

In order to achieve the aforementioned object, a semiconductor device according to the present invention includes: a package provided with a mounting face for a semiconductor element; a frame body of the package formed so that the package opens one face among four peripheral faces bordering the mounting face and an upper face opposing the mounting face; a plurality of lead terminals fixed to the frame body; a semiconductor element electrically connected to the lead terminals and mounted on the mounting face; a cap connected so as to border a face of the frame body in a laser light output direction which is to form a periphery of an aperture portion formed on the upper face of the frame body opposing the mounting face and one face among the four peripheral faces bordering the mounting face, and which seals the semiconductor element inside the package; and a transparent member placed provided with a penetrating hole on a face of the cap in the laser light output direction and through which laser light can be outputted, wherein the semiconductor element is mounted so that a laser light output position of the semiconductor element is proximal to the transparent member.

In addition, the semiconductor element is mounted on the mounting face via a submount.

In addition, the semiconductor element is a semiconductor laser element.

In addition, the semiconductor element is a nitride semiconductor laser element.

In addition, a light receiving element is jointly mounted.

In addition, an optical component is provided in the penetrating hole.

In addition, a boundary portion between an upper side of the frame body opposing the mounting face and the laser light output direction-side of the semiconductor element is formed as a curved surface.

In addition, a portion on the laser light output direction-side of the semiconductor element of the frame body is formed inclined.

In addition, a fin is provided on at least one of the lateral faces of the package.

In addition, a depression is provided on the fin.

Furthermore, a method of manufacturing a semiconductor device according to the present invention is a method of manufacturing the semiconductor device previously described, wherein, when connecting the cap to the package, the method includes the steps of: continuously fixing the cap on the upper face of the package up to the aperture face in the laser light output direction by seam welding using a roller electrode; and fixing the cap onto a base of the aperture face in the laser light output direction and a side of the upper face parallel to the base by seam welding using a roller electrode.

Moreover, production equipment of a semiconductor device according to the present invention is production equipment of a semiconductor device to be used in the method of manufacturing a semiconductor device previously described, the production equipment including: two roller electrodes disposed parallel to each other; a power supply that applies electrical energy to the roller electrodes; a mechanism for moving the roller electrodes while applying weight in a horizontal direction; a mechanism for rotating the semiconductor device by 90 degrees or for sliding the roller electrodes upwards/downwards; and a mechanism for adjusting the movement speed of the roller electrodes.

DESCRIPTION OF THE EMBODIMENTS

Figure 1A:
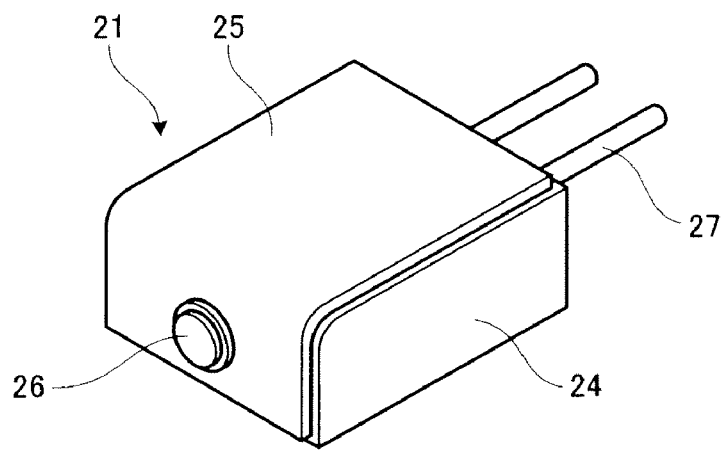
FIG. 1A is a diagram showing the configuration of a semiconductor device according to a first embodiment.

A semiconductor device according to embodiments of the present invention will now be described with reference to the drawings. It should be noted that descriptions of components shown in the drawings with the same reference numerals may be omitted.

First Embodiment

A first embodiment will now be described using FIGS. 1A, 1B, 1C, 2, 3A, 3B, 4A, 4B, 4C, 5, 6, and 7.

Figure 1B:
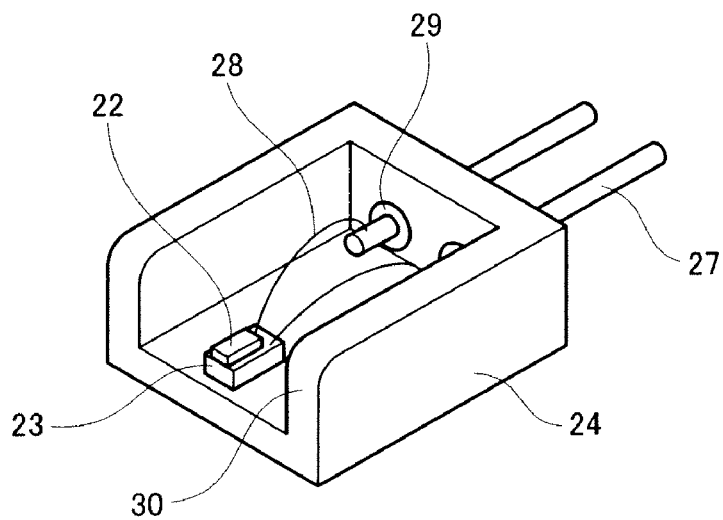
FIG. 1B is a diagram showing the configuration of the semiconductor device according to the first embodiment.
Figure 1C:
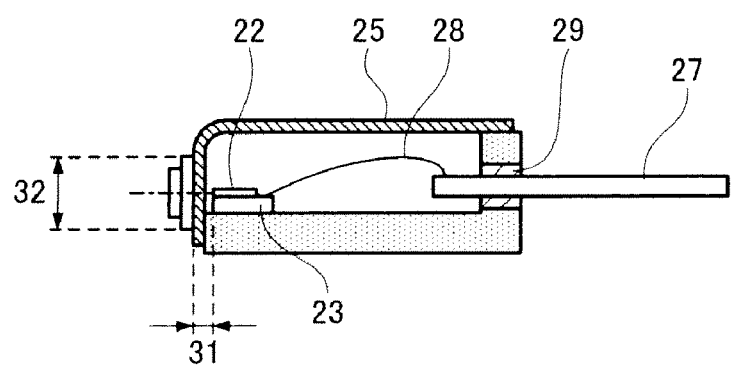
FIG. 1C is a diagram showing the configuration of the semiconductor device according to the first embodiment.
Figure 2:
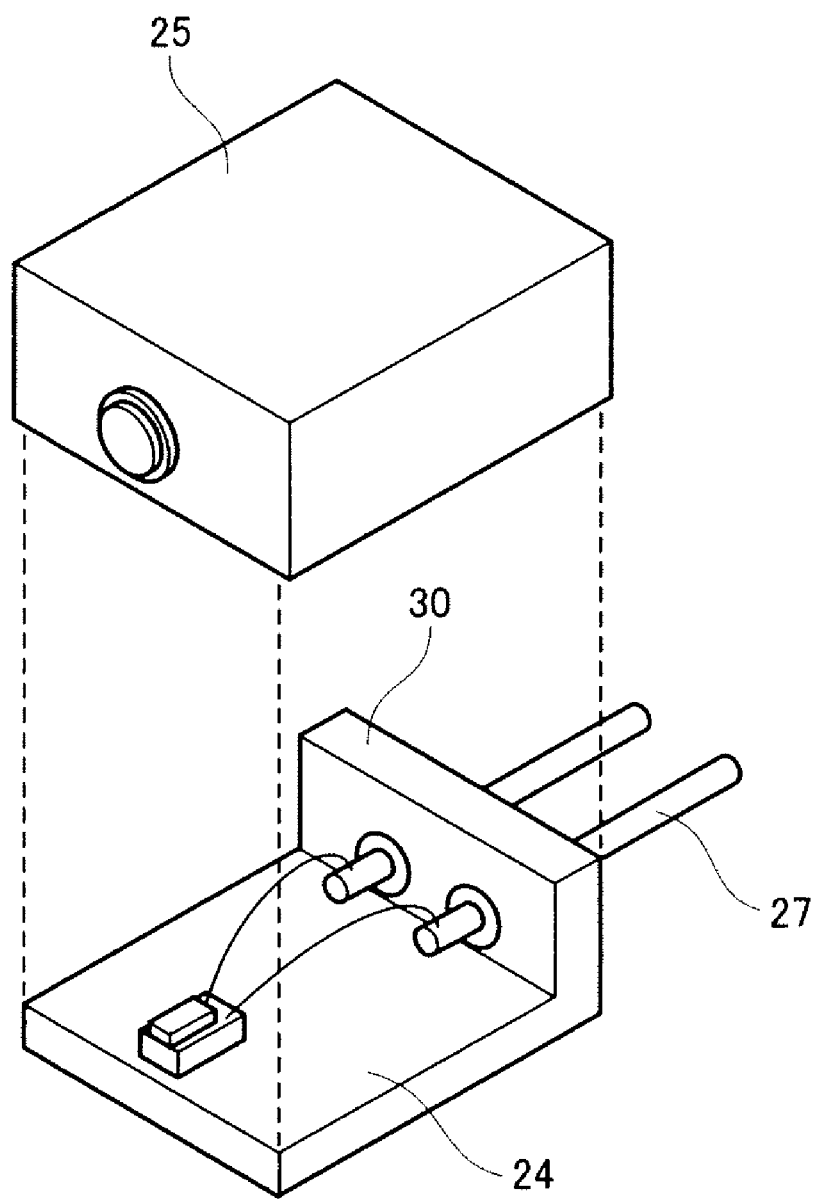
FIG. 2 is a diagram showing the configuration of the semiconductor device whose lateral face is formed by a cap, according to the first embodiment.
Figure 3A:
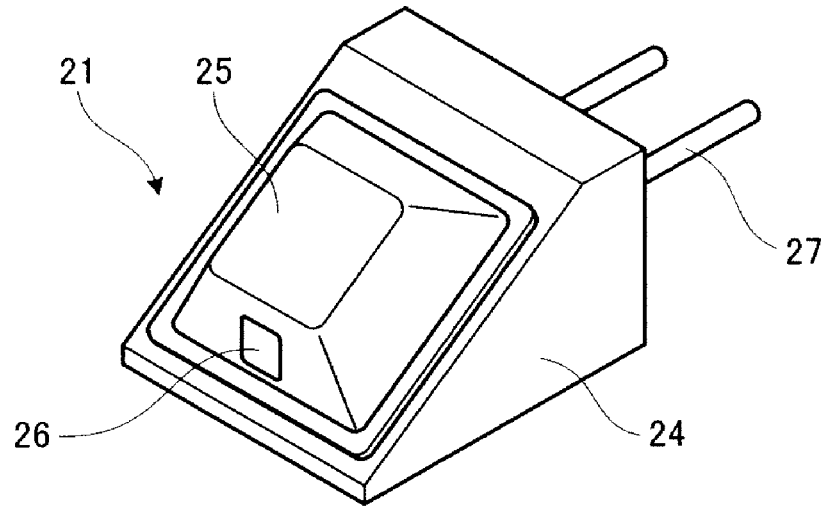
FIG. 3A is a diagram showing the configuration of the semiconductor device whose aperture face is formed by an inclined cap, according to the first embodiment.
Figure 3B:
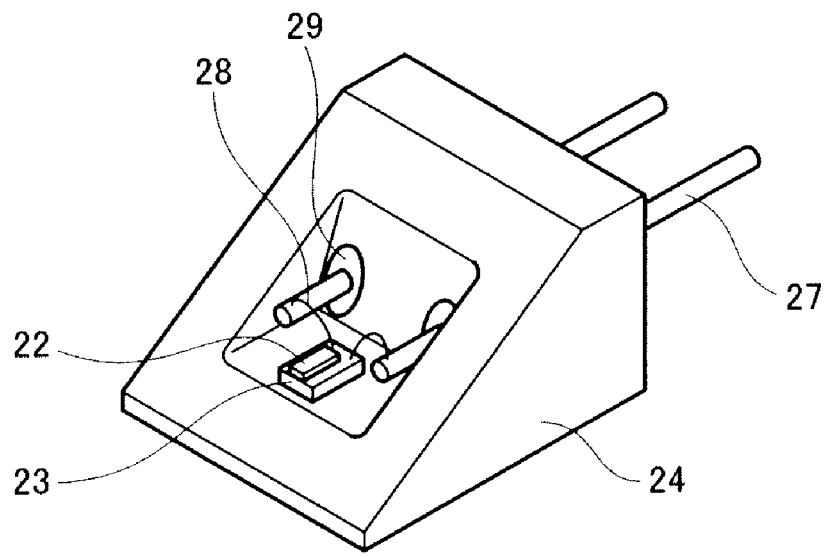
FIG. 3B is a diagram showing the configuration of the semiconductor device whose aperture face is formed by the inclined cap, according to the first embodiment.
Figure 4A:
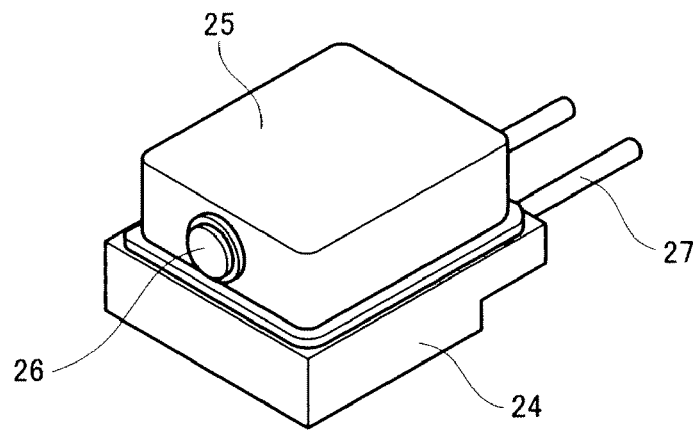
FIG. 4A is a diagram showing the configuration of the semiconductor device having a structure in which a cap is fixed on a package base material, according to the first embodiment.
Figure 4B:
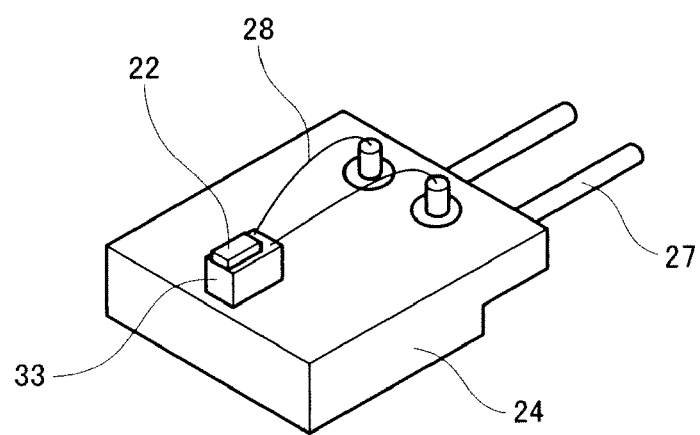
FIG. 4B is a diagram showing the configuration of the semiconductor device having the structure in which the cap is fixed on the package base material, according to the first embodiment.
Figure 4C:
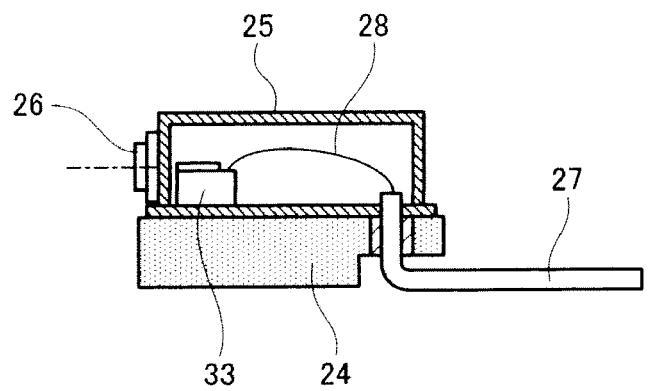
FIG. 4C is a diagram showing the configuration of the semiconductor device having the structure in which the cap is fixed on the package base material, according to the first embodiment.
Figure 5:
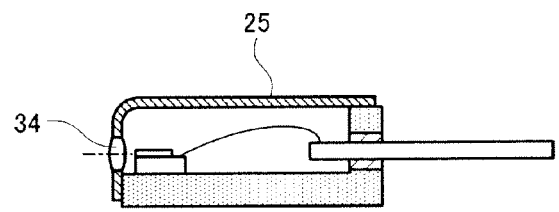
FIG. 5 is a diagram showing the configuration of the semiconductor device mounted with a collimating lens, according to the first embodiment.
Figure 6:
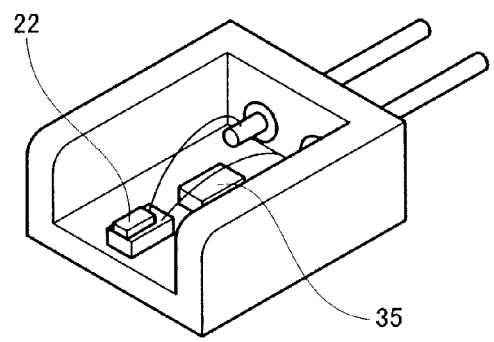
FIG. 6 is a diagram showing the configuration of the semiconductor device mounted with a light receiving element, according to the first embodiment.
Figure 7:
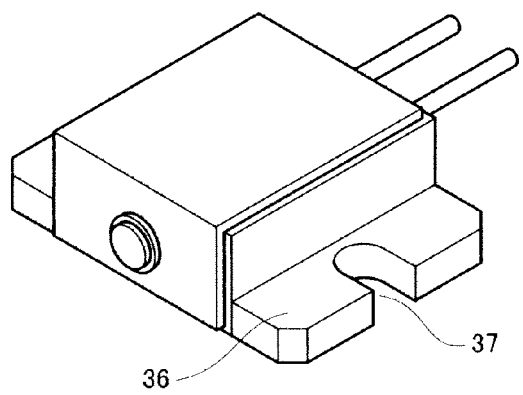
FIG. 7 is a diagram showing the configuration of the semiconductor device provided with a fin, according to the first embodiment.

FIGS. 1A, 1B, and 1C are diagrams showing the configuration of a semiconductor device according to the first embodiment. FIG. 1A is a perspective view; FIG. 1B is a perspective view in which a cap has been removed to offer a better view of an internal configuration of the semiconductor device; and FIG. 1C is a cross-sectional view. FIG. 2 is a diagram showing the configuration of the semiconductor device whose lateral face is formed by a cap, according to the first embodiment. FIGS. 3A and 3B are diagrams showing the configuration of the semiconductor device whose aperture face is formed by an inclined cap, according to the first embodiment. FIG. 3A is a perspective view; and FIG. 3B is a perspective view in which the cap has been removed to offer a better view of an internal configuration of the semiconductor device. FIGS. 4A, 4B, and 4C are diagrams showing the configuration of the semiconductor device having a structure in which a cap is fixed on a package base material, according to the first embodiment. FIG. 4A is a perspective view; FIG. 4B is a perspective view in which the cap has been removed to offer a better view of an internal configuration of the semiconductor device; and FIG. 4C is a cross-sectional view. FIG. 5 is a diagram showing the configuration of the semiconductor device mounted with a collimating lens, according to the first embodiment. FIG. 6 is a diagram showing the configuration of the semiconductor device mounted with a light receiving element, according to the first embodiment. FIG. 7 is a diagram showing the configuration of the semiconductor device provided with a fin, according to the first embodiment.

In FIGS. 1A, 1B, and 1C, a semiconductor device 21 according to the present invention includes: a semiconductor element 22; a submount 23 for the semiconductor element 22; a package 24; a cap 25 provided with a penetrating hole for allowing passage of a laser light outputted by the semiconductor element 22; a transparent member such as a piece of glass 26 fixed to the penetrating hole; a pair of lead terminals 27; a wire 28 connecting both anode and cathode electrodes of the semiconductor element 22 and the lead terminals 27; and a piece of low-melting glass 29 for fixing the lead terminals 27 to a penetrating hole provided on the package 24.

The package 24 is provided with a metallic frame body 30 so as to cover a mounting portion of the semiconductor element 22, and is formed so that at least one face of the frame body 30 is opened. The semiconductor element 22 is mounted on the semiconductor element mounting face of the package using solder material while orienting a laser light output face of the semiconductor element 22 mounted on the submount 23 in the direction of the package aperture face. Since the frame body 30 of the package does not exist on the laser light output face of the semiconductor element 22 during this mounting step, no interference occurs between a collet adsorbing the semiconductor element 22 and the package 24. Therefore, the semiconductor element 22 can be mounted with the laser light output face of the semiconductor element 22 and the package aperture face close to each other. More specifically, the semiconductor element 22 can be mounted while keeping the distance between the laser light output face of the semiconductor element 22 and the package aperture face within 0.4 mm.

As described above, by mounting the semiconductor element 22 with the laser light output face of the semiconductor element 22 and the package aperture face close to each other, it is now possible to reduce a distance 31 from the laser light output face of the semiconductor element 22 to an end face of the penetrating hole provided on the cap 25 for allowing passage of laser light, thereby reducing a radius 32 of the penetrating hole provided on the cap 25 and of the piece of glass 26. More specifically, considering the distance between the laser light output face of the semiconductor element 22 and the package aperture face, as well as cap thickness, the distance from the laser light output face to the end face of the penetrating hole provided on the cap 25 for allowing passage of laser light can be kept within 0.5 mm. In addition, while it is required that the angle of spread of laser light outputted from the semiconductor element 22 be at least 30 degrees, since the distance from the laser output position of the semiconductor element 22 to the piece of glass 26 is reduced, a region across which the laser light spreads becomes smaller and the radius 32 of the penetrating hole provided on the cap 25 and of the piece of glass is calculated from the distance and the angle of spread to be 0.29 mm. This measurement is equal to or less than half that of a conventional semiconductor device, and enables production of a low-profile semiconductor device with a thickness equal to or less than 2 mm.

According to the configuration of the present embodiment, it is now possible to reduce the thickness of a semiconductor device while retaining the characteristics of a semiconductor laser, thereby achieving a lowered profile of the semiconductor device.

In addition, the semiconductor device 21 according to the present invention can be made airtight, after connecting both the anode and cathode electrodes of the semiconductor element 22 and the lead terminals 27 by the wire 28, by mounting the cap 25 to the package 24, and fixing the cap 25 with seam welding. It is well known that adhesives used when fixing a piece of glass to a package include organic compounds, and in the case where the semiconductor element to be mounted to the semiconductor device is a nitride semiconductor laser, laser light outputted from the nitride semiconductor laser chemically reacts with the organic compounds, whereby the deposition of the compounds on an output end face of the nitride semiconductor laser causes degradation of the characteristics and reliability of the nitride semiconductor laser. In addition of not using material that includes organic compounds inside the package, by hermetically sealing the semiconductor device through the use of low-melting glass and seam welding, high reliability can be achieved even when the semiconductor element is a nitride semiconductor laser.

Furthermore, the border between the upper portion of the frame body and the laser irradiating face can take the form of a curved surface. In the case where an upper-side corner portion on an aperture end face-side of the frame body provided on a package lateral face is an acute angle, seam-welding of this corner portion changes the area of contact and prevents current from being concentrated, thereby causing poor weld and prevents a hermetically sealed semiconductor device from being achieved. However, by arranging the border between the upper portion of the frame body and the laser irradiating face to take the form of a curved surface, seam welding can be continuously performed and air tightness can be achieved.

Moreover, as shown in FIG. 2, the semiconductor device according to the present invention may be configured so that only the frame body 30 of a face that fixes the lead terminals 27 to the package 24 is formed while a lateral face is formed on the cap 25.

In addition, as shown in FIGS. 3A and 3B, the semiconductor device 21 according to the present invention may be arranged so as to include: the semiconductor element 22; the submount 23 for the semiconductor element 22; the package 24; the cap 25 provided with a penetrating hole for allowing passage of laser light outputted by the semiconductor element 22; a transparent member such as the piece of glass 26 fixed to the penetrating hole; the pair of lead terminals 27; the wire 28 connecting both the anode and cathode electrodes of the semiconductor element 22 and the lead terminals 27; and the piece of low-melting glass 29 for fixing the lead terminals 27 to a penetrating hole provided on the package 24, wherein an aperture face is obliquely formed from an upper face to a bottom face of the package 24. In this case, the cap 25 that fixes the piece of glass 26 is fixed to the oblique aperture face formed on the package 24 by resistance welding.

As described above, by obliquely forming the aperture face that is a laser irradiating face of the package 24, a highly hermetic semiconductor device can be readily produced while maintaining a lower profile and without having to process curved surfaces on the package 24 and the cap 25. In addition, since a portion fixing the package 24 and the cap 25 is formed so as to enclose an outer periphery with a same face, resistance welding can be selected as the method for fixing the cap 25 to the package 24. While seam welding requires a welding time of several seconds in proportion to an extended distance to be welded, with resistance welding, the time necessary for welding can be reduced to 0.5 seconds or less, significantly increasing productivity and achieving cost reduction.

Furthermore, as shown in FIGS. 4A, 4B, and 4C, the semiconductor device according to the present invention may be configured such that only a platform 33 for mounting the semiconductor element 22 is formed on a base of the package 24 and the lead terminals 27 are bent 90 degrees on a rear face of the package. Moreover, in a similar manner as in FIG. 2, a whole lateral face may be formed on the cap 25 and the cap may be fixed on the package base by resistance welding.

Thus, it is now possible to form a portion that fixes the cap 25 onto the base of the package 24 so that an outer periphery is enclosed by a same face, and by fixing the package 24 and the cap 25 by resistance welding in a manner similar to the description of FIGS. 3A and 3B, welding time can be significantly reduced and cost reduction can be achieved.

In addition, as shown in FIG. 5, by affixing a collimating lens 34 to the penetrating hole provided on the cap 25, laser light outputted from the semiconductor element 22 can be made into parallel light. Adopting this configuration eliminates the need for a collimating lens when the semiconductor device is mounted on an optical pickup device, enabling downsizing of the optical pickup device and, in turn, downsizing of an optical disk drive.

Meanwhile, for a rewritable optical disk, controlling optical output of a high-output semiconductor laser is important. An excessive increase in optical output may disadvantageously erase information recorded on the optical disk. In addition, a heavy load applied to the semiconductor laser may adversely affect reliability. Furthermore, optical output lower than predetermined output when recording on the optical disk may disadvantageously prevent previously recorded contents from being sufficiently erased and may result in insufficient recording. Recorded information may not be read accurately. Therefore, it is extremely important that the optical output of the high-output semiconductor laser is kept constant and accurately controlled. In order to do so, normally, a part of laser light outputted from the high-output semiconductor laser towards the optical disk is detected and a current value of a laser power supply is controlled based on the detected value so that optical output becomes constant.

In consideration thereof, as shown in FIG. 6, it is useful to mount a light receiving element 35 for optical output monitoring on the package base in order to detect a part of the optical output of the high-output semiconductor laser. By forming the light receiving element 35 for optical output monitoring posterior to a rear end face of the semiconductor element 22, a part of laser light (not shown) outputted from the rear end face of the semiconductor element 22 is received, optical output of the entire laser light is estimated, and a current value that drives the laser light can be controlled so that desired optical output is accurately maintained. Therefore, constant-output laser light can be outputted from the semiconductor device in a further stable manner.

Furthermore, by providing a fin 36 on a package lateral face as shown in FIG. 7 so that heat generated by the semiconductor element is dissipated not only from the package rear face but also from the fin 36 provided on the package lateral face, heat dissipation can be improved. Consequently, deterioration of the semiconductor element itself due to the heat generated therefrom can be prevented to potentially improve reliability of the semiconductor device.

Moreover, providing a depression 37 on the fin 36 ensures accurate positioning of the package when the semiconductor device according to the present embodiment is being manufactured and, for example, improves mounting accuracy of the semiconductor element. The mounting accuracy of the semiconductor device can also be improved during manufacturing of an optical pickup device, resulting in an increased yield when manufacturing semiconductor devices and optical pickup devices.

In the present embodiment, while the package has been described using a metallic package, a resin package or a ceramic package may be used instead, and a package of any material or form may be used as long as such material or form is usable in an optical device.

In addition, while a semiconductor laser device having a pair of lead terminals has been primarily described, the number of lead terminals may be set to any number depending on the functions of the semiconductor device.

Second Embodiment

Figure 8A:
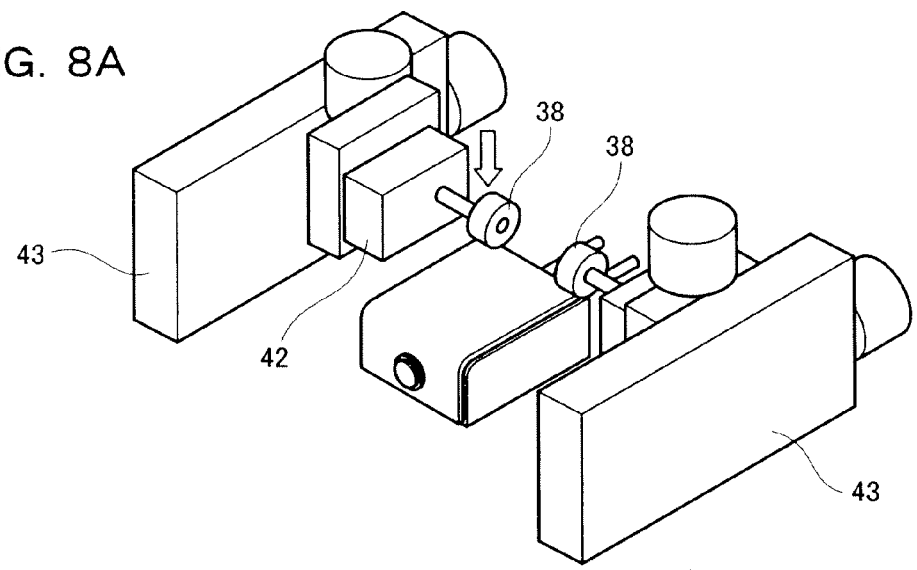
FIG. 8A is a diagram describing the method of manufacturing a semiconductor device according to a second embodiment.
Figure 8B:
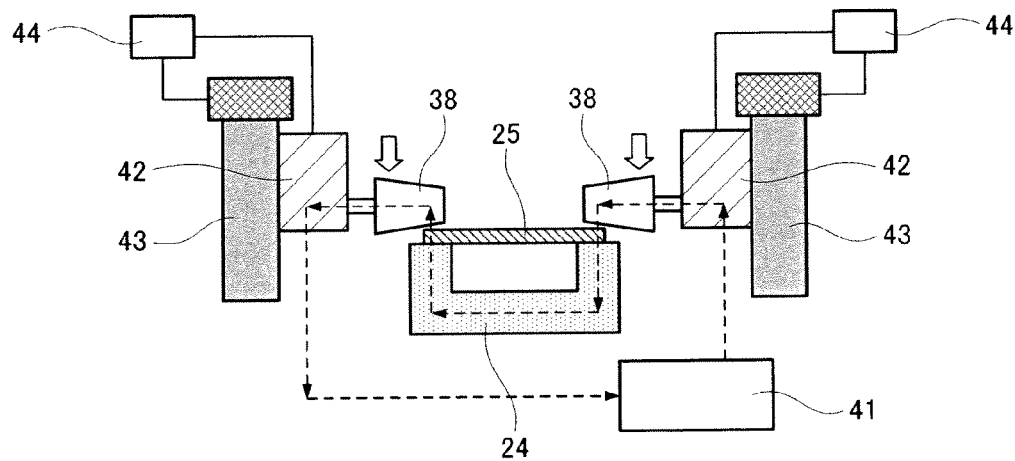
FIG. 8B is a diagram describing the method of manufacturing a semiconductor device according to the second embodiment.
Figure 8C:
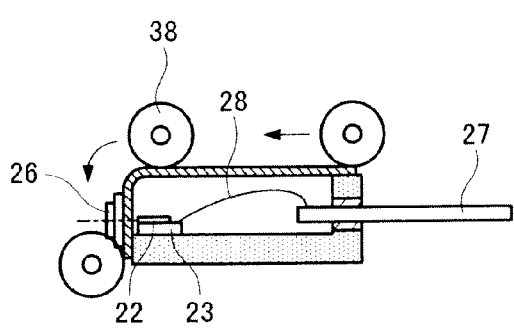
FIG. 8C is a diagram describing the method of manufacturing a semiconductor device according to the second embodiment.
Figure 8D:
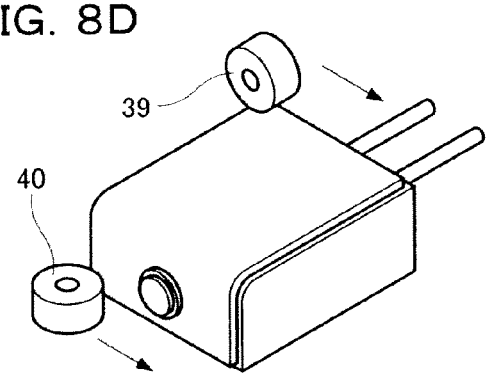
FIG. 8D is a diagram describing the method of manufacturing a semiconductor device according to the second embodiment.

FIGS. 8A, 8B, 8C, and 8D are diagrams describing a method of manufacturing a semiconductor device according to a second embodiment. FIG. 8A is a perspective view showing a situation where sides on both sides of a frame body of a package and an upper face of the package are welded, and production equipment; FIG. 8B is a schematic diagram showing the situation where the sides on both sides of the package frame body and the upper face of the package are welded, and the production equipment; FIG. 8C is a cross-sectional view showing the situation where the sides on both sides of the package frame body and the upper face of the package are welded; and FIG. 8D is a perspective view showing a situation where a base of an aperture face of the package and the upper face are welded.

In FIGS. 8A, 8B, 8C, and 8D, the production equipment of a semiconductor device according to the present invention includes: a mechanism (not shown) for conveying and fixing a semiconductor device 21; two roller electrodes, namely, first and second roller electrodes 38, disposed parallel to each other; a welding power supply 41 that applies electrical energy to the roller electrodes 38; a pressurizing mechanism 42 that pressurizes the roller electrodes 38 that have come into contact with the semiconductor device; and a moving mechanism 43 that moves the roller electrodes 38.

The manufacturing method according to the present embodiment is carried out in the following sequence. With respect to a package 24 in which an upper-side corner portion of an aperture end face-side of a frame body provided on a lateral face of the package made of metal is given a rounded shape, a semiconductor element 22 mounted on a submount 23 is first connected to a package base using solder material, and both anode and cathode electrodes of the semiconductor element 22 are connected with lead terminals 27 by a wire 28. The package 24 mounted with the semiconductor element 22 and connected to the lead terminals 27 by the wire 28 is conveyed and positioned. A cap 25 with a piece of glass 26 fixed in a penetrating hole thereof is then mounted on and fixed to the package 24. On the package upper faces of the sides on both sides of the package frame body, the two roller electrodes 38 disposed parallel to each other are then brought into contact with the cap 25 (FIG. 8A), and as shown in FIG. 8B, electrical energy is applied from the welding power supply 41 to the two roller electrodes 38 to cause a current to flow along a route indicated by an arrow, enabling the contact location of the package frame body and the cap 25 to be welded and fixed. While applying electrical energy and pressing the roller electrodes 38 in a package upper face-direction and an aperture end face-direction using the pressurizing mechanism 42 of the roller electrodes 38, the roller electrodes 38 are then moved in a package aperture face direction by the moving mechanism 43 for the roller electrodes 38, and the aperture face rounded portion up to a side of the aperture face are continuously seam-welded to fix the package 24 and the cap 25. At this point, a controller 44 of the moving mechanism 43 for the roller electrodes 38 feeds back a value of a pressure sensor provided on the pressurizing mechanism 42 of the roller electrodes 38 to the controller 44 of the moving mechanism 43 for the roller electrodes 38 and controls the positions and movement speeds of the roller electrodes 38 so that the pressure value becomes constant. While a method of moving the roller electrodes 38 has been described, a method involving moving a semiconductor device-side and rotating the same by 90 degrees may also be used. Subsequently, as shown in FIG. 8D, the base of the package aperture face and a side fixing the lead terminals 27 of the upper face which are disposed at positions forming a 90-degree angle are disposed so that a plane of rotation of a fourth roller electrode 40 forms a 90-degree angle with respect to a plane of rotation of a third roller electrode 39. The third roller electrode 39 is brought into contact with the upper face of the package aperture face while the fourth roller electrode 40 is brought into contact with the base of the package aperture face, and are respectively fixed by seam welding.

In addition, production equipment for realizing the manufacturing method includes: a mechanism (not shown) for conveying the package 24 and the cap 25; a mechanism (not shown) for positioning and fixing the package 24; a mechanism for mounting the cap 25 on the package 24; the first and second roller electrodes 38; the welding power supply 41 that applies electrical energy to the roller electrodes 38; the pressurizing mechanism 42 provided with a pressure sensor and which pressurizes the roller electrodes 38 having come into contact with the semiconductor device; the moving mechanism 43 capable of moving the roller electrodes 38 laterally and vertically with respect to the semiconductor device; the controller 44 for adjusting the position and movement speed of the roller electrodes 38 so as to conform to the rounded shape of a frame body corner portion; the third roller electrode 39; and the fourth roller electrode 40 disposed so as to have a 90-degree angle with the third roller electrode 39. A mechanism for adjusting the angle of the roller electrode 39 can be provided in place of the fourth roller electrode 40. In addition, while production equipment that moves the roller electrodes 38 has been described, equipment that moves the semiconductor device and rotates the same by 90 degrees may also be used.

With the manufacturing method and production equipment of the same according to the present embodiment, in the semiconductor device presented in the first embodiment, since sides on both sides of the upper portion of the frame body and the laser irradiating face and a side of the curved surface that is the border thereof can be continuously seam-welded and, at the same time, the base of the package aperture face disposed at the position having a 90-degree angle and the side fixing the lead terminals 27 of the upper face can be seam-welded, a lower profile and hermetic sealing can be achieved.

Third Embodiment

Figure 9:
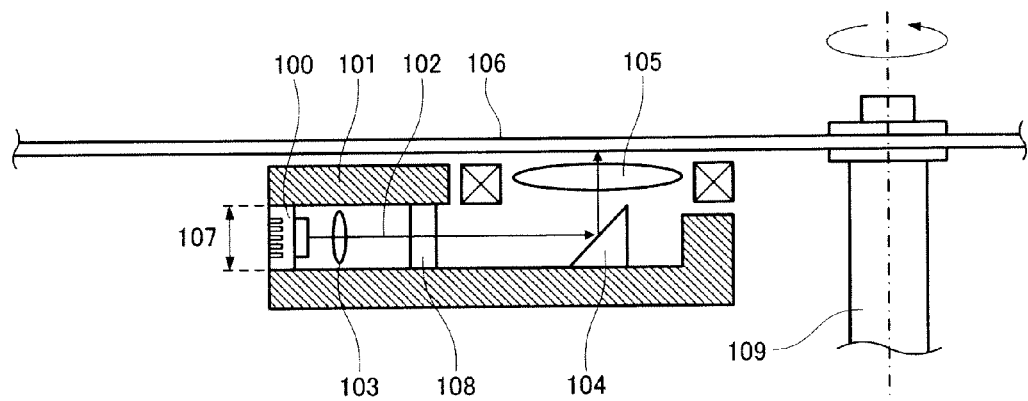
FIG. 9 is a schematic diagram showing an optical pickup device according to a third embodiment.

FIG. 9 is a schematic diagram showing an optical pickup device according to a third embodiment. The schematic diagram shows an optical pickup device 101 mounted with the semiconductor device presented in the first embodiment.

In FIG. 9, laser light 102 outputted from a semiconductor laser chip (not shown) of a semiconductor device 100 is collimated to parallel light by an optical component 103 such as a collimating lens, has its optical path bent by 90 degrees by an erecting mirror 104, and is focused on a pit recorded on an optical disk 106 by an objective lens 105. Having read a signal on the pit, the laser light 102 is reflected by the optical disk 106, proceeds along the same route in the opposite direction, and returns to the semiconductor device 100. At this point, the laser light 102 is bifurcated by a diffraction optical component 108 disposed between the optical component 103 and the erecting mirror 104, collected by the optical component 103, and enters a light receiving element (not shown) to read the signal recorded on the optical disk. The optical disk 106 is rotated by a rotary shaft 109 rotated by a spindle motor.

Figure 12:
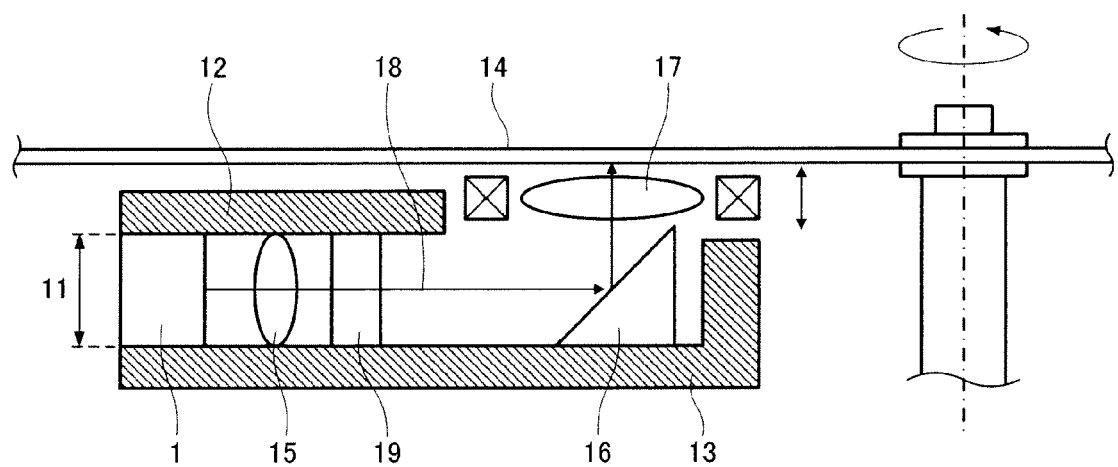
FIG. 12 is a schematic diagram exemplifying a conventional optical pickup device mounted with the conventional semiconductor device.

The thickness of the optical pickup device 101 configured as previously described is determined by a thickness 107 of the semiconductor device 100. With the present embodiment, a thickness that is 80 percent the thickness of a conventional optical pickup device 12 shown in FIG. 12 can be achieved.

Figure 10:
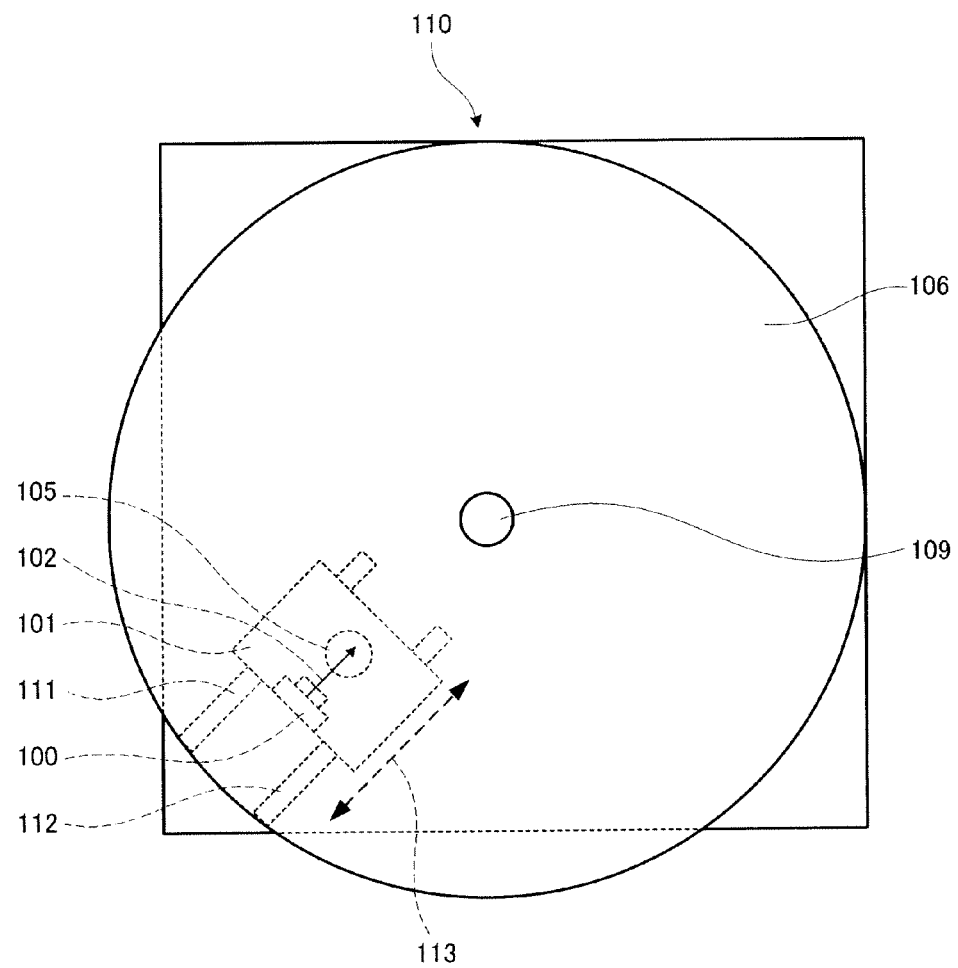
FIG. 10 is a schematic configuration diagram showing an optical disk drive device using an optical pickup device according to the present invention.
Figure 11A:
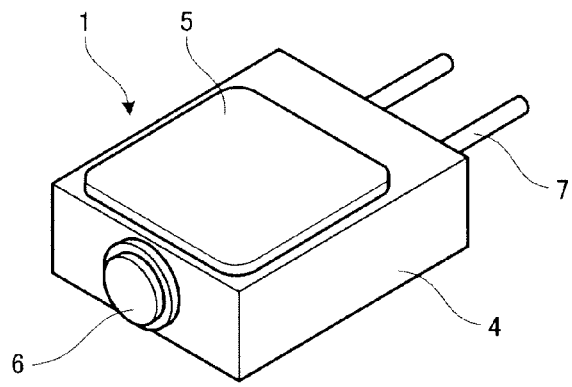
FIG. 11A is a structural schematic diagram of a conventional semiconductor device.
Figure 11B:
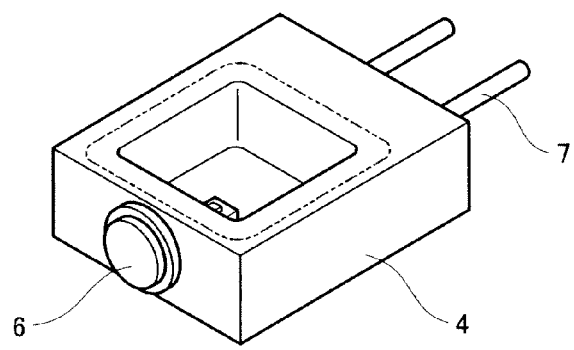
FIG. 11B is a structural schematic diagram of the conventional semiconductor device.
Figure 11C:
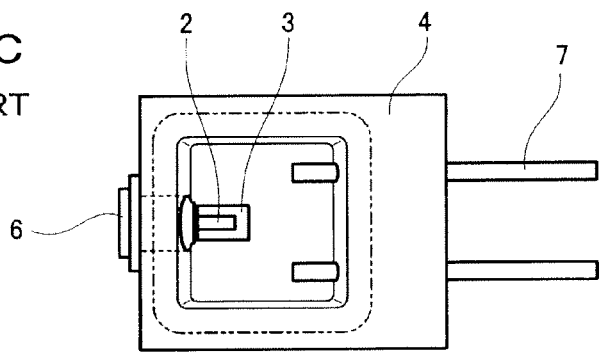
FIG. 11C is a structural schematic diagram of the conventional semiconductor device.
Figure 11C:
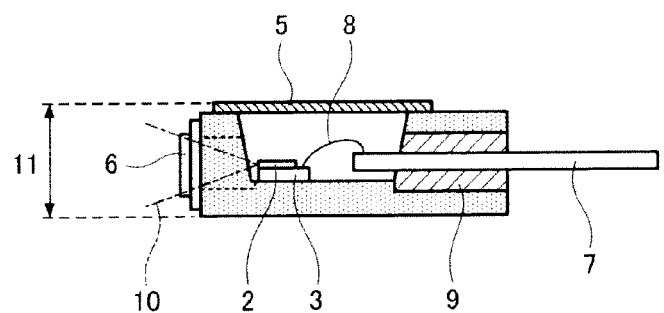

FIG. 10 is a schematic configuration diagram showing an optical disk drive device using the optical pickup device according to the present invention, and represents an optical disk drive device (hereinafter referred to as an optical disk drive) 110 using the optical pickup device 101 according to the present embodiment.

In FIG. 10, the optical disk drive 110 drives the rotary shaft 109 by a drive mechanism that rotates the optical disk 106. In order to record and reproduce signals of the optical disk 106, the optical pickup device 101 is moved in a movement direction 113 by support shafts 111 and 112 of a traverse mechanism that is movable in a radial direction of the optical disk 106. Since the optical pickup device 101 is mounted with the profile-lowered semiconductor device 100 according to the present invention, the profile of the optical pickup device 101 is lowered as described with reference to FIG. 9.

Moreover, in the present embodiment, a multiple-wavelength laser such as a two-wavelength laser or a three-wavelength laser may be used. In addition, a semiconductor laser chip may be formed monolithically or hybrid mounting involving a plurality of chips may be adopted.

What is claimed is:

1. A semiconductor device comprising:
   a package provided with a mounting face for a semiconductor element;
   a frame body of the package formed so that the package opens one face among four peripheral faces bordering the mounting face and an upper face opposing the mounting face;
   a plurality of lead terminals fixed to the frame body;
   a semiconductor element electrically connected to the lead terminals and mounted on the mounting face;
   a cap connected so as to border a face of the frame body in a laser light output direction which is to form a periphery of an aperture portion formed on the upper face of the frame body opposing the mounting face and one face among the four peripheral faces bordering the mounting face, and which seals the semiconductor element inside the package; and
   a transparent member placed in a penetrating hole provided on a face of the cap in the laser light output direction and through which laser light can be outputted, wherein
   the semiconductor element is mounted so that a laser light output position of the semiconductor element is proximal to the transparent member.

2. The semiconductor device according to claim 1, wherein the semiconductor element is mounted on the mounting face via a submount.

3. The semiconductor device according to claim 1, wherein the semiconductor element is a semiconductor laser element.

4. The semiconductor device according to claim 1, wherein the semiconductor element is a nitride semiconductor laser element.

5. The semiconductor device according to claim 3, wherein a light receiving element is jointly mounted.

6. The semiconductor device according to claim 4, wherein a light receiving element is jointly mounted.

7. The semiconductor device according to claim 3, wherein an optical component is provided in the penetrating hole.

8. The semiconductor device according to claim 4, wherein an optical component is provided in the penetrating hole.

9. The semiconductor device according to claim 3, wherein a boundary portion between an upper side of the frame body opposing the mounting face and a laser light output direction-side of the semiconductor element is formed as a curved surface.

10. The semiconductor device according to claim 4, wherein a boundary portion between an upper side of the frame body opposing the mounting face and a laser light output direction-side of the semiconductor element is formed as a curved surface.

11. The semiconductor device according to claim 3, wherein a portion on a laser light output direction-side of the semiconductor element of the frame body is formed inclined.

12. The semiconductor device according to claim 4, wherein a portion on a laser light output direction-side of the semiconductor element of the frame body is formed inclined.

13. The semiconductor device according to claim 1, wherein a fin is provided on at least one of lateral faces of the package.

14. The semiconductor device according to claim 13, wherein a depression is provided on the fin.

15. A method of manufacturing the semiconductor device according to claim 9, comprising, when connecting the cap to the package, the steps of:
   continuously fixing the cap on the upper face of the package up to the aperture face in the laser light output direction by seam welding using a roller electrode; and
   fixing the cap onto a base of the aperture face in the laser light output direction and a side of the upper face parallel to the base by seam welding using a roller electrode.

16. Production equipment of a semiconductor device to be used in the method of manufacturing a semiconductor device according to claim 15, the production equipment comprising:
   two roller electrodes disposed parallel to each other;
   a power supply that applies electrical energy to the roller electrodes;
   a mechanism for moving the roller electrodes while applying weight in a horizontal direction;
   a mechanism for rotating the semiconductor device by 90 degrees or for sliding the roller electrodes upwards/downwards; and
   a mechanism for adjusting movement speed of the roller electrodes.

* * * * *